(12) United States Patent
You

(10) Patent No.: US 12,400,978 B2
(45) Date of Patent: Aug. 26, 2025

(54) SEMICONDUCTOR PACKAGE

(71) Applicant: SAMSUNG ELECTRONICS CO., LTD., Suwon-si (KR)

(72) Inventor: Seho You, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 575 days.

(21) Appl. No.: 17/732,709

(22) Filed: Apr. 29, 2022

(65) Prior Publication Data

US 2022/0375884 A1   Nov. 24, 2022

(30) Foreign Application Priority Data

May 18, 2021   (KR) .................. 10-2021-0064222

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/3672* (2013.01);
(Continued)

(58) Field of Classification Search
CPC ............... H01L 23/367; H01L 23/3128; H01L 23/3157; H01L 23/3672; H01L 23/49816; H01L 23/5383; H01L 23/5386; H01L 23/5389; H01L 24/02; H01L 24/19;
(Continued)

(56) References Cited

U.S. PATENT DOCUMENTS 8,269,337 B2   9/2012   Hu et al.
8,736,031 B2   5/2014   Lee et al.
(Continued)

FOREIGN PATENT DOCUMENTS

CN   110943054 A * 3/2020 ............. H01L 21/56
KR   10-1208241     11/2012

OTHER PUBLICATIONS

Andreas Stelzer et al., "Integrated Microwave Sensors in SiGe with Antenna in Package:", ICECOM(2016), 8 pages.
(Continued)

*Primary Examiner* — Fazli Erdem
(74) *Attorney, Agent, or Firm* — Morgan, Lewis & Bockius LLP

(57) ABSTRACT

A semiconductor package includes a semiconductor chip comprising an active surface and an inactive surface facing each other. At least one antenna module is arranged adjacent to the semiconductor chip. The at least one antenna module comprises a main antenna and a sub-antenna. A redistribution structure is disposed on the semiconductor chip and the at least one antenna module. The redistribution structure electrically connects the active surface of the semiconductor chip to the at least one antenna module. A molding member surrounds the semiconductor chip and the at least one antenna module. The inactive surface of the semiconductor chip and the main antenna are exposed from the molding member, and the sub-antenna is covered by the molding member.

20 Claims, 15 Drawing Sheets

(51) Int. Cl.
    *H01L 21/56*     (2006.01)
    *H01L 21/683*     (2006.01)
    *H01L 23/00*     (2006.01)
    *H01L 23/31*     (2006.01)
    *H01L 23/367*     (2006.01)
    *H01L 23/538*     (2006.01)
    *H01Q 1/22*     (2006.01)
    *H01Q 21/00*     (2006.01)
    *H01Q 21/06*     (2006.01)

(52) U.S. Cl.
    CPC ...... *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01); *H01Q 21/0025* (2013.01); *H01Q 21/065* (2013.01); *H01L 2221/68372* (2013.01); *H01L 2223/6677* (2013.01); *H01L 2224/214* (2013.01)

(58) Field of Classification Search
    CPC ....... H01L 24/20; H01L 24/24; H01Q 1/2283; H01Q 21/065
    USPC .......................................... 257/428
    See application file for complete search history.

(56) References Cited

U.S. PATENT DOCUMENTS

| | | | |
|---|---|---|---|
| 9,196,951 | B2 | 11/2015 | Baks et al. |
| 9,337,526 | B2 | 5/2016 | Hong et al. |
| 9,711,465 | B2 | 7/2017 | Liao et al. |
| 9,721,920 | B2 | 8/2017 | Beer et al. |
| 9,991,216 | B2 | 6/2018 | Liao et al. |
| 10,368,442 | B2 | 7/2019 | Yu et al. |
| 10,461,399 | B2 | 10/2019 | Ndip et al. |
| 10,700,024 | B2 | 6/2020 | So et al. |
| 10,790,244 | B2 | 9/2020 | Huang et al. |
| 2015/0070228 | A1* | 3/2015 | Gu ............... H01Q 25/00 343/727 |
| 2015/0280327 | A1 | 10/2015 | Spella |
| 2016/0056544 | A1* | 2/2016 | Garcia ........... H01Q 9/0407 343/725 |
| 2016/0126634 | A1 | 5/2016 | Liu et al. |
| 2016/0178730 | A1* | 6/2016 | Trotta ............ G01S 13/931 342/175 |
| 2018/0191052 | A1* | 7/2018 | Ndip ............. H01L 24/20 |
| 2021/0384645 | A1* | 12/2021 | Jia ............... H01Q 1/243 |
| 2022/0247065 | A1* | 8/2022 | Zhu .............. H01L 24/16 |
| 2023/0420396 | A1* | 12/2023 | Acikalin ......... H01L 23/66 |

OTHER PUBLICATIONS

C.-T, Wang et al., "InFO_AIP Technology for High Performance and Compact 5G Millimeter Wave System Integration", ECTC(2018), pp. 202-207.

Guochi Huang et al., "A low cost 60GHz antenna in Fan-Out Panel Level Package for millimeter-wave radar application", ICEPT(2020), 4 pages.

M. PourMousavl et al., "Antenna Design and Characterization for a 61 GHz Transceiver in eWLB Package", European Microwave Integrated Circuit Conference (2013), pp. 1415-1418.

Imran Aziz et al., "Broadband Fan-out Phased Antenna Array at 28 GHz for 5G Applications", EUMC(2020), pp. 212-215.

* cited by examiner

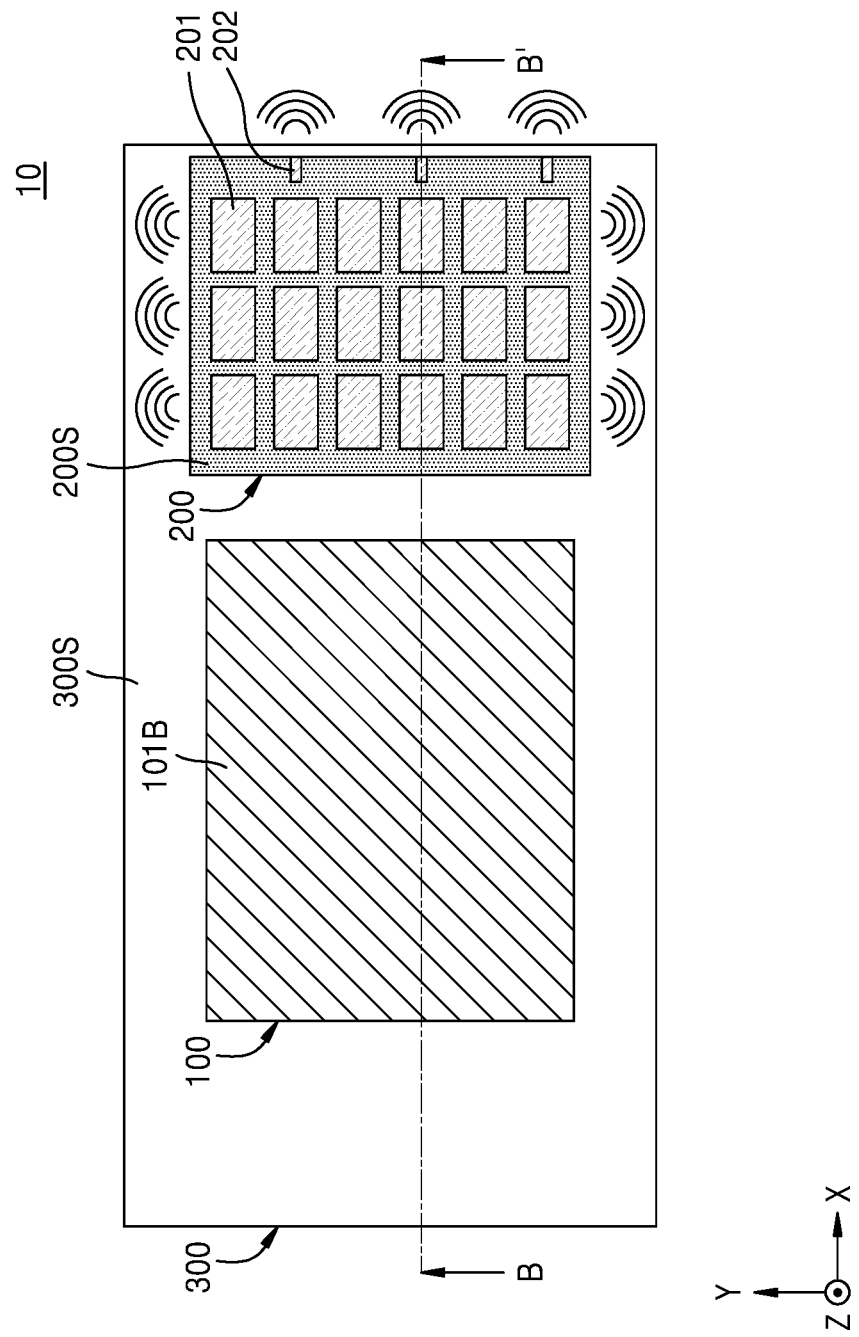

SEMICONDUCTOR PACKAGE

CROSS-REFERENCE TO RELATED APPLICATION

This application claims priority under 35 U.S.C. § 119 to Korean Patent Application No. 10-2021-0064222, filed on May 18, 2021 in the Korean Intellectual Property Office, the disclosure of which is incorporated by reference in its entirety herein.

1. TECHNICAL FIELD

The present inventive concept relates to a semiconductor package, and more particularly, to a semiconductor package including an antenna module.

2. DISCUSSION OF RELATED ART

As the manufacturing technology and wireless communication technology of a semiconductor package has increased, a semiconductor package having an integrated antenna has been developed. For example, a method of forming an antenna pattern in a redistribution layer of a semiconductor package has been developed. However, providing a sufficient radiation performance of the antenna may result in a constraint in design of the semiconductor package or the occurrence of performance errors. Accordingly, a semiconductor chip is desired in which a semiconductor chip and the antenna module are stably integrated so that a degree of freedom of design is increased and the occurrence of performance error is reduced or prevented.

SUMMARY

An embodiment of the present inventive concept provides a semiconductor package in which a semiconductor chip and the antenna module are stably integrated so that a degree of freedom of design is increased and a performance error is reduced.

The issues to be solved by embodiments of the present inventive concept are not limited to the above-mentioned issues, and other issues not mentioned may be clearly understood by those of ordinary skill in the art from the following description.

According to an embodiment of the present inventive concept, a semiconductor package includes a semiconductor chip comprising an active surface and an inactive surface facing each other. At least one antenna module is arranged adjacent to the semiconductor chip. The at least one antenna module comprises a main antenna and a sub-antenna. A redistribution structure is disposed on the semiconductor chip and the at least one antenna module. The redistribution structure electrically connects the active surface of the semiconductor chip to the at least one antenna module. A molding member surrounds the semiconductor chip and the at least one antenna module. The inactive surface of the semiconductor chip and the main antenna are exposed from the molding member, and the sub-antenna is covered by the molding member.

According to an embodiment of the present inventive concept, a semiconductor package includes a semiconductor chip comprising an active surface and an inactive surface facing each other. At least one antenna module is arranged adjacent to the semiconductor chip. The at least one antenna module comprises a main antenna and a sub-antenna. A redistribution structure is disposed on the semiconductor chip and the at least one antenna module. The redistribution structure electrically connects the active surface of the semiconductor chip to the at least one antenna module. A molding member surrounds the semiconductor chip and the at least one antenna module. A heat discharging member is arranged on the semiconductor chip. The main antenna is exposed from the molding member, and the sub-antenna is covered by the molding member. A thickness of the at least one antenna module is greater than a thickness of the semiconductor chip.

According to an embodiment of the present inventive concept, a semiconductor package includes a semiconductor chip comprising an active surface and an inactive surface facing each other. A molding member comprises an opening in a portion thereof, and surrounding the semiconductor chip. At least one antenna module is arranged in the opening of the molding member. The at least one antenna module comprises a main antenna and a sub-antenna on a printed circuit board. A redistribution structure is arranged under the semiconductor chip, the molding member, and the at least one antenna module. The redistribution structure electrically connects the active surface of the semiconductor chip to the at least one antenna module. An external connection member is arranged under the redistribution structure. The main antenna is exposed to the outside from the molding member, and the sub-antenna directly contacts the molding member.

BRIEF DESCRIPTION OF THE DRAWINGS

Embodiments of the present inventive concept will be more clearly understood from the following detailed description taken in conjunction with the accompanying drawings in which:

FIG. 1A is a plan view of a semiconductor package according to an embodiment of the present inventive concept;

DETAILED DESCRIPTION OF EMBODIMENTS

Hereinafter, embodiments of the present inventive concept are described in detail with reference to the accompanying drawings.

Figure 1B:
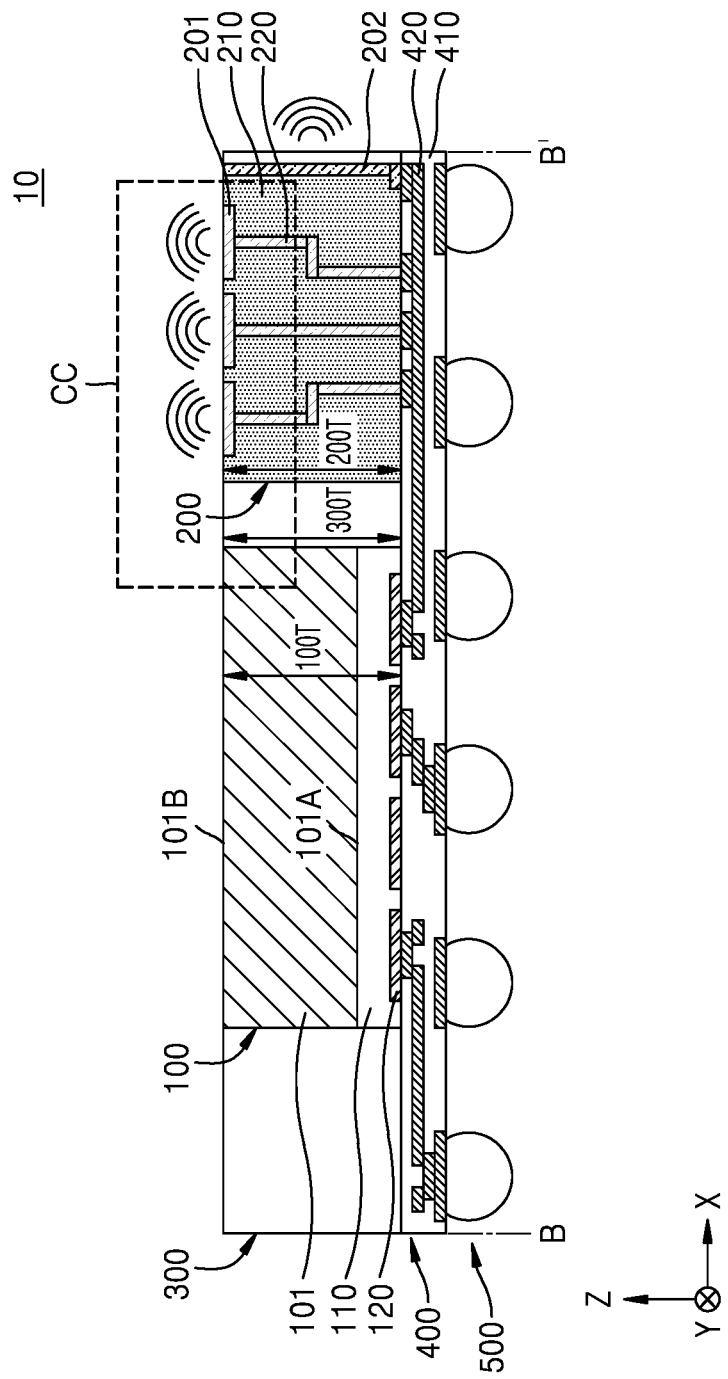
FIG. 1B is a cross-sectional view taken along line B-B' of FIG. 1A according to an embodiment of the present inventive concept.
Figure 1C:
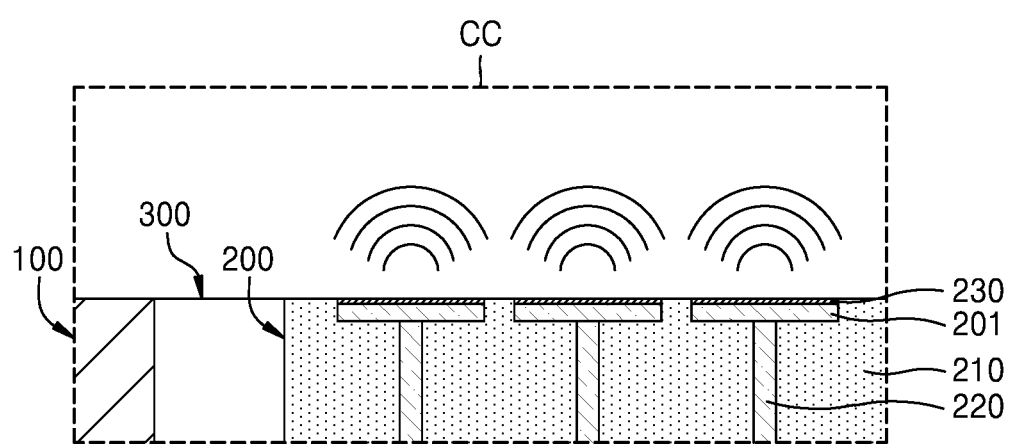
FIG. 1C is an enlarged view of region CC in FIG. 1B according to an embodiment of the present inventive concept.

FIG. 1A is a plan view of a semiconductor package 10 according to an embodiment, FIG. 1B is a cross-sectional view taken along line B-B' in FIG. 1A, and FIG. 1C is an enlarged view of region CC in FIG. 1B.

Referring to FIGS. 1A through 1C, the semiconductor package 10 of the present inventive concept may include a semiconductor chip 100, an antenna module 200 including a main antenna 201 and a sub-antenna 202, a molding member 300, a redistribution structure 400, and an external connection member 500.

The semiconductor chip 100 may be used in an electronic device including a semiconductor element. The semiconductor chip 100 may include a semiconductor substrate 101 having an active surface 101A and an inactive surface 101B facing each other. For example, in an embodiment, the active surface 101A and the inactive surface 101B may be spaced apart from each other in the Z direction which is a thickness direction of the semiconductor chip 100. In an embodiment, a circuit unit for implementing an integrated circuit function of the semiconductor chip 100 may be formed on the active surface 101A of the semiconductor substrate 101 by using a semiconductor manufacturing process. For example, in an embodiment, an individual unit element, a metal layer, an interlayer insulating layer 110, and an electrode pad 120 may be formed on the active surface 101A of the semiconductor substrate 101.

In an embodiment, the semiconductor chip 100 may include a logic chip or a memory chip. The logic chip may include, for example, a microprocessor, an analog element, or a digital signal processor. In addition, the memory chip may include, for example, a volatile memory such as dynamic random access memory (RAM) (DRAM) and static RAM (SRAM), or a non-volatile memory such as phase-change RAM (PRAM), magnetoresistive RAM (MRAM), resistive RAM (RRAM), and ferroelectric RAM (FRAM). In an embodiment, the semiconductor chip 100 may include a high bandwidth memory.

In an embodiment, the semiconductor chip 100 may be a communication chip that includes a signal processing circuit for processing a wireless signal. For example, the semiconductor chip 100 may include a radio-frequency integrated circuit. For example, the semiconductor chip 100 may include a radio-frequency integrated circuit for a millimeter wave (mmWave) having a wavelength in a range of about 1 mm to about 10 mm and a wavelength close thereto. The semiconductor chip 100 may include a radio-frequency integrated circuit for a frequency band in a range of about 28 GHz to about 300 GHz and a frequency band adjacent thereto.

In addition, in other embodiments, the semiconductor chip 100 may have a chiplet structure including a plurality of semiconductors.

In an embodiment, the antenna module 200 may include the main antenna 201, the sub-antenna 202, a base board 210, and a wiring layer 220. A thickness 200T (e.g., length in the Z direction) of the antenna module 200 may be substantially the same as a thickness 100T (e.g., length in the Z direction) of the semiconductor chip 100.

In an embodiment, the main antenna 201 may include a patch antenna. The patch antenna includes a plurality of parts, which are separated from each other. For example, as shown in an embodiment of FIG. 1A, the patch antenna may include a plurality of patches that are arranged in a plurality of rows extending in the X direction and columns extending in the Y direction in the uppermost surface 200S of the antenna module 200. In addition, at least a portion of the main antenna 201 may be arranged to be exposed to the outside. For example, as shown in FIGS. 1B-1C, in an embodiment, an upper surface of the main antenna 201 may be exposed to the outside. In an embodiment, the main antenna 201 may include, for example, a director, a radiator, and a reflector. The main antenna 201 may transceive a wireless signal of mmWave.

In an embodiment, the sub-antenna 202 may include a Yagi antenna. In an embodiment, the sub-antenna 202 may be arranged at a certain interval (e.g., a first interval) on one side surface of the antenna module 200, such as one lateral side surface of the antenna module 200. The sub-antenna 202 may include, for example, a director, a projector, and a reflector. The sub-antenna 202 may transceive a wireless signal of mmWave.

In an embodiment, each of the main antenna 201 and the sub-antenna 202 may include, for example, electrolytically deposited (ED) copper, a rolled-annealed (RA) copper foil, a stainless steel foil, an aluminum foil, an ultra-thin copper foil, sputtered copper, copper alloys, nickel, stainless steel, beryllium copper, etc. However, embodiments of the present inventive concept are not limited thereto.

The base board 210 may include a printed circuit board (PCB). However, embodiments of the present inventive concept are not limited thereto and the base board 210 may vary. In an embodiment, the base board 210 may include at least one material selected from phenol resin, epoxy resin, and polyimide. In an embodiment, the base board 210 may include at least one material selected from FR4, tetrafunctional epoxy, polyphenylene ether, epoxy/polyphenylene oxide, bismaleimide triazine, thermount, cyanate ester, polyimide, and liquid crystal polymer. However, embodiments of the present inventive concept are not limited thereto.

The wiring layer 220 may penetrate the base board 210 and electrically connect the main antenna 201 and the sub-antenna 202 to the redistribution structure 400. For example, in an embodiment, the wiring layer 220 may extend from an upper surface of the antenna module 200 to a lower surface of the antenna module 200. In an embodiment, the wiring layer 220 may include, sputtered copper, copper alloys, nickel, stainless steel, beryllium copper, etc. The wiring layer 220 may include a plurality of layers. However, embodiments of the present inventive concept are not limited thereto and the material of the wiring layer 220 and the number of layers of the wiring layer 220 may vary. In an embodiment, the wiring layer 220 may include a first wiring layer electrically connecting the main antenna 201 to the redistribution structure 400 and a second wiring layer electrically connecting the sub-antenna 202 to the redistribution structure 400.

As shown in FIG. 1C, in some embodiments, the antenna module 200 may further include an antenna protection layer 230 covering an upper surface of the main antenna 201. The antenna protection layer 230 may function as an antioxidant layer preventing oxidation of the main antenna 201. In an embodiment, the antenna protection layer 230 may include, for example, polyimide, polyester, photoimageable coverlay (PIC), a photo-imageable solder resist, an organic solderability preservative, etc. However, embodiments of the present inventive concept are not limited thereto.

The molding member 300 may protect the semiconductor chip 100 and the antenna module 200 from external influences such as contamination and impact. In an embodiment, the molding member 300 may include an epoxy mold compound, resin, etc. In addition, the molding member 300 may be formed by a process such as compression molding, lamination, and screen printing. In some embodiments, the molding member 300 may be formed to expose the inactive surface 101B of the semiconductor chip 100 and the uppermost surface 200S of the antenna module 200 to the outside. At least a portion of the main antenna 201 may be exposed from the molding member 300, and the sub-antenna 202 may be arranged to be covered by the molding member 300 and the sub-antenna 202 directly contacts the molding member 300. For example, as shown in the embodiment of FIG. 1B, an upper surface of the main antenna 201 may be exposed by the molding member 300. These may be characteristics of the semiconductor package 10 according to an embodiment of the present inventive concept, and detailed descriptions thereof will be given later.

The molding member 300 may constitute an outer shape of the semiconductor package 10, and the redistribution structure 400 may be arranged by using the molding member 300. As shown in FIG. 1B, in an embodiment, the redistribution structure 400 may be disposed on lower surfaces of the semiconductor chip 100, the antenna module 200 and the molding member 300. In an embodiment, the thickness 100T (e.g., length in the Z direction) of the semiconductor chip 100, the thickness 200T (e.g., length in the Z direction) of the antenna module 200, and a thickness 300T (e.g., length in the Z direction) of the molding member 300 may be substantially the same as each other. For example, a level (e.g., length in the Z direction from an upper surface of the redistribution structure 400) of the uppermost surface the semiconductor chip 100 (e.g., a level of an upper surface of the inactive surface 101B), a level of the uppermost surface 200S of the antenna module 200, and a level of the uppermost surface 300S of the molding member 300 may be substantially the same as each other (e.g., substantially co-planar in the Z direction).

The redistribution structure 400 may include an insulating layer 410 and a metal distribution layer 420. In an embodiment, the redistribution structure 400 may include copper (Cu), nickel (Ni), gold (Au), chromium (Cr), titanium (Ti), or palladium (Pd), or may include the metal distribution layer 420 including an alloy thereof. The metal distribution layer 420 may be formed by using an electroplating process. However, embodiments of the present inventive concept are not limited thereto and the composition of the redistribution structure 400 and the method of forming the redistribution structure 400 may vary.

The metal distribution layer 420 of the redistribution structure 400 may be arranged to electrically connect the electrode pad 120 of the semiconductor chip 100 to the wiring layer 220 of the antenna module 200. For example, the metal distribution layer 420 may connect a portion of the electrode pad 120, which processes a communication signal, to the wiring layer 220.

In addition, the metal distribution layer 420 of the redistribution structure 400 may be arranged to electrically connect the electrode pad 120 of the semiconductor chip 100 to the external connection member 500. For example, the metal distribution layer 420 may connect the other portion of the electrode pad 120, which functions as a ground, to the external connection member 500.

In an embodiment, the external connection member 500 may include a solder ball or a solder bump. In some embodiments, a material constituting the external connection member 500 may include a lead free solder including tin (Sn). The semiconductor package 10 may be connected to an external device, such as a main board, etc., via the external connection member 500.

Electronic devices have become increasingly miniaturized and multi-functional according to the rapid development of the electronics industry and demands of users. Accordingly, the semiconductor chip 100 used in an electronic device has become increasingly miniaturized and multi-functional. Accordingly, an interval of the electrode pad 120 included in the semiconductor package 10 has been increasingly reduced.

When the number of electrode pads 120 for miniaturization or inputs/outputs of the semiconductor chip 100 are increased, the semiconductor package 10 may not accommodate all signal terminals in the semiconductor chip 100. Accordingly, the semiconductor package 10 may extend the redistribution structure 400 to the outside of the semiconductor chip 100, and may expand a region in which the electrode pad 120 is arranged. For example, in some embodiments, a fan-out wafer level package (FO-WLP), or a fan-out panel level package (FO-PLP) (hereinafter, both are referred to as the FO-WLP) may be applied to the semiconductor package 10.

Accordingly, in an embodiment, the semiconductor package 10 having a general FO-WLP structure may arrange the external connection member 500 on an expanded surface of the semiconductor package 10 by forming the redistribution structure 400 on the electrode pad 120, and a position of the electrode pad 120 and a position where the external connection member 500 is formed may be varied by using the redistribution structure 400.

However, as packaging technology and wireless communication technology have advanced, a technology of integrating an antenna inside the semiconductor package has been developed. In some embodiments, a method of forming an antenna pattern in a redistribution layer of a semiconductor package is employed. In this embodiment, since the redistribution layer used as an antenna is not exposed to the outside to secure radiation performance of the antenna, there may be a constraint of the design, or there may be an increased occurrence of performance errors.

However, the semiconductor package 10 according to the present inventive concept may insert the antenna module 200 into the molding member 300 and expose the main antenna 201 to the outside (e.g., to the air) in the FO-WLP structure to reduce signal loss due to impedance matching.

In addition, the semiconductor package 10 according to an embodiment of the present inventive concept may separate the semiconductor chip 100 and the antenna module 200 into completely independent bodies, and may reduce interference between the main antenna 201 and the sub-antenna 202, and the semiconductor chip 100.

In addition, the semiconductor package 10 according to the present inventive concept may reduce constraints of the design (e.g., a thickness and a size of a patch) of the main antenna 201, due to the design rule of the redistribution structure 400.

Therefore, the semiconductor package 10 according to an embodiment of the present inventive concept may increase the degree of freedom of design and decrease the occurrence of a performance error by stably integrating the semiconductor chip 100 and the antenna module 200.

Figure 2:
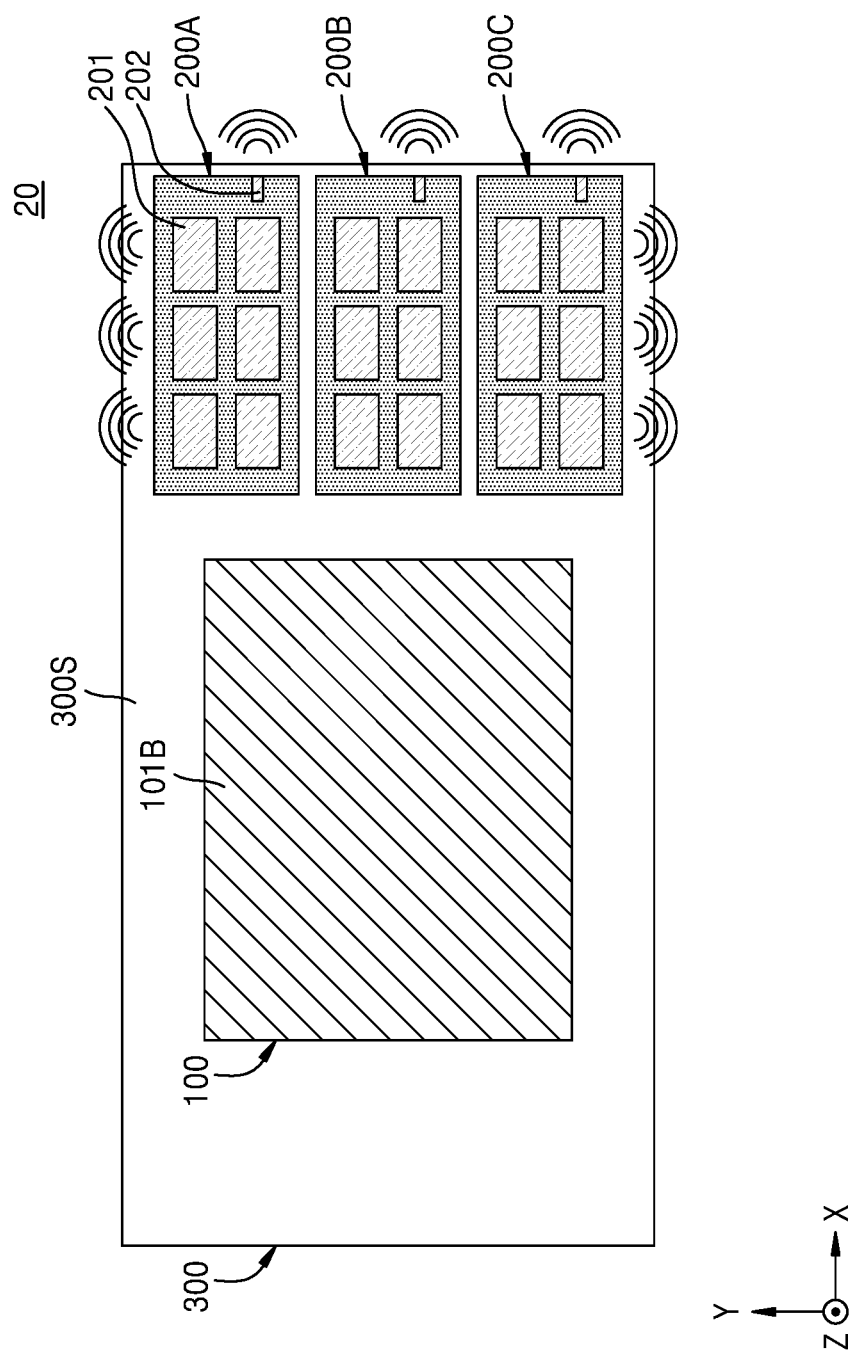
FIG. 2 is a plan view of a semiconductor package according to an embodiment of the present inventive concept.

FIG. 2 is a plan view of a semiconductor package 20 according to an embodiment of the present inventive concept.

Most of the components constituting the semiconductor package 20 and materials included in the components to be described below may be substantially the same as or similar to those described with reference to FIGS. 1A through 1C. Thus, for convenience of description, differences from the semiconductor package 10 described above are mainly described and a repeated description of similar or identical components may be omitted.

Referring to FIG. 2, the semiconductor package 20 may include the semiconductor chip 100, first to third antenna modules 200A, 200B, and 200C, the molding member 300, a redistribution structure, and an external connection member.

The first to third antenna modules 200A, 200B, and 200C may each be constituted by a plurality of parts, which are separated from each other, and each of the plurality of parts may be arranged to be spaced apart by a certain interval from any side surface of the semiconductor chip 100. For example, the plurality of parts may form a group, and form the first to third antenna modules 200A, 200B, and 200C. However, embodiments of the present inventive concept are not limited thereto and the number of the plurality of antenna modules may vary.

Each of the plurality of parts of the first to third antenna modules 200A, 200B, and 200C may include the main antenna 201, the sub-antenna 202, a base board, and a wiring layer. In some embodiments, each of the plurality of parts of the first to third antenna modules 200A, 200B, and 200C may include a PCB. In an embodiment, a thickness (e.g., length in the Z direction) of each of the plurality of parts of the first to third antenna modules 200A, 200B, and 200C may be substantially the same as the thickness 100T of the semiconductor chip 100.

Figure 3A:
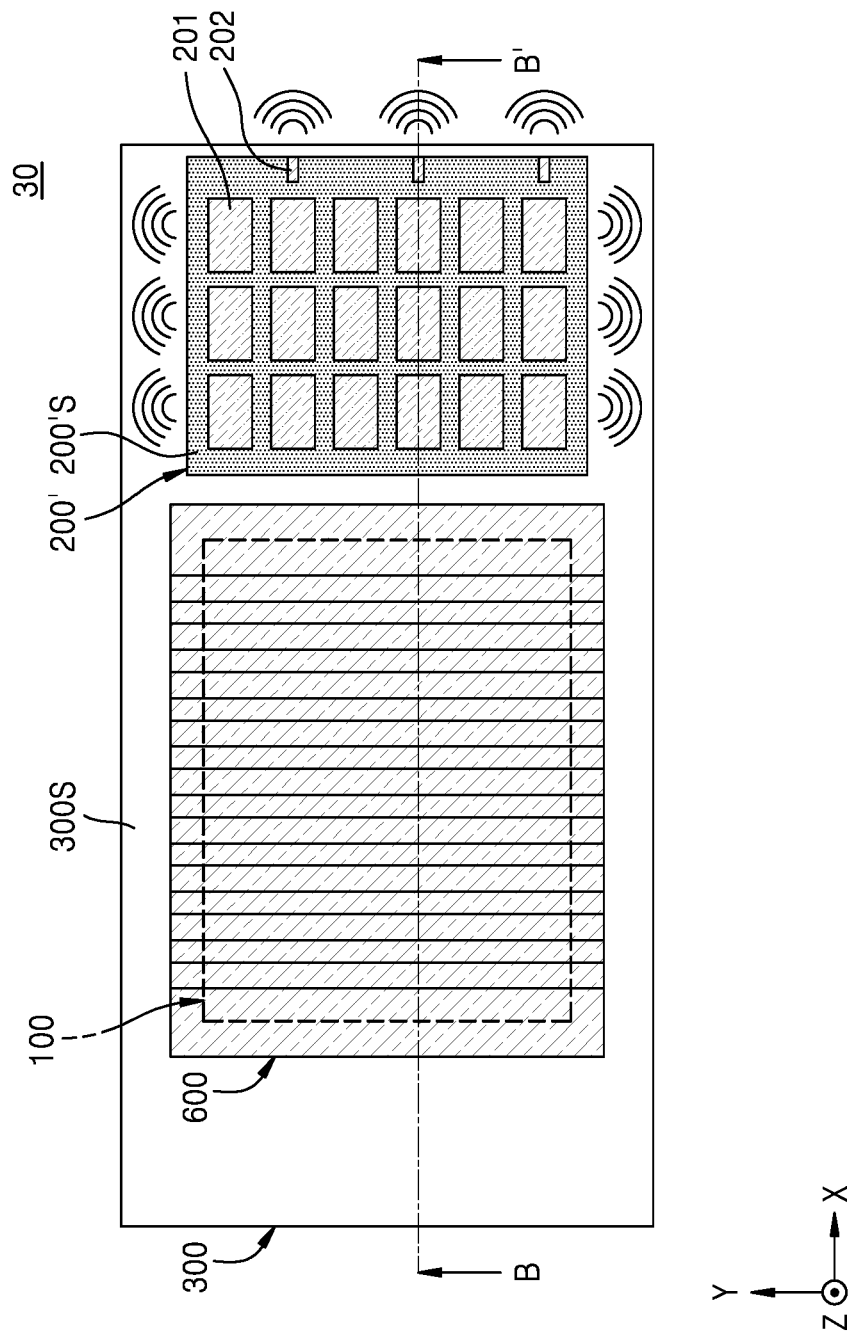
FIG. 3A is a plan view of a semiconductor package according to an embodiment of the present inventive concept.
Figure 3B:
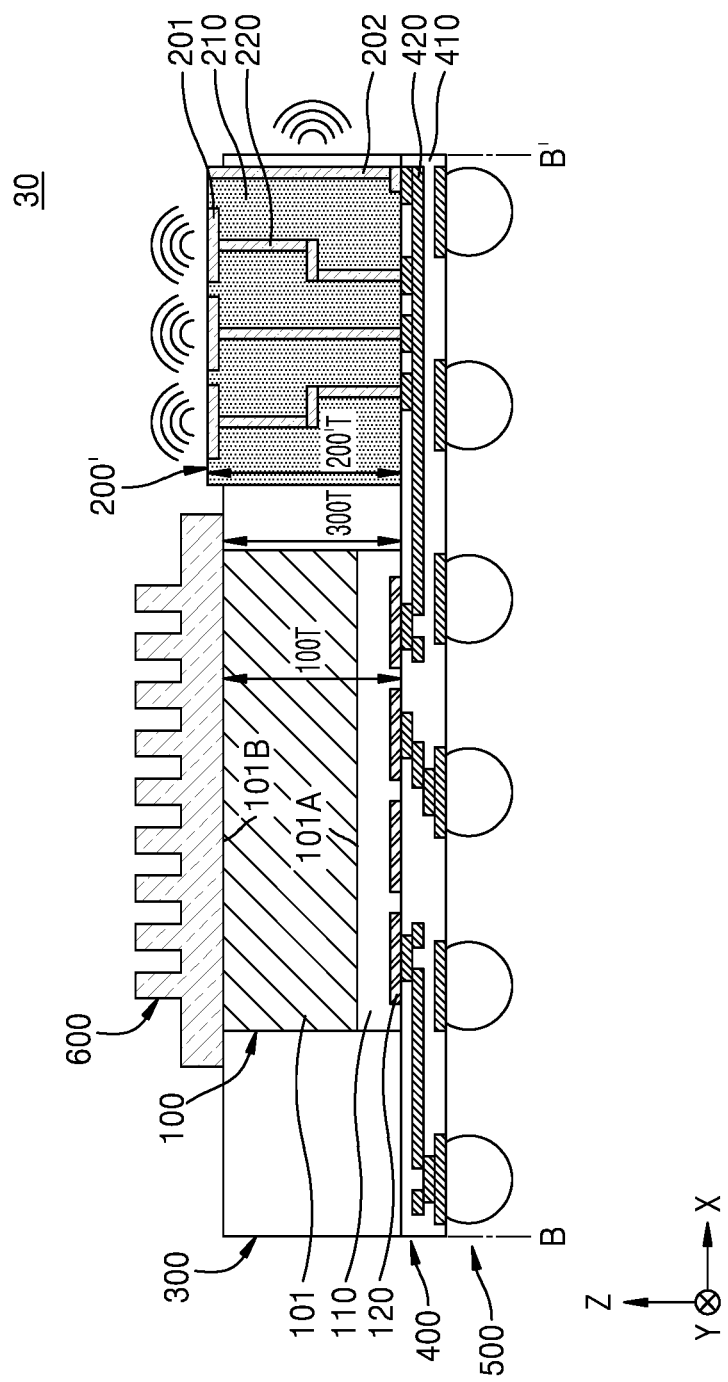
FIG. 3B is a cross-sectional view taken along line B-B' of FIG. 3A according to an embodiment of the present inventive concept.

FIG. 3A is a plan view of a semiconductor package 30 according to an embodiment of the present inventive concept, and FIG. 3B is a cross-sectional view taken along line B-B' in FIG. 3A.

Most of components constituting the semiconductor package 30 and materials included in the components to be described below may be substantially the same as or similar to those described with reference to FIGS. 1A through 1C. Thus, for convenience of description, differences from the semiconductor package 10 described above are mainly described and a repeated description of similar or identical components may be omitted.

Referring to FIGS. 3A and 3B together, the semiconductor package 30 according to an embodiment of the present inventive concept may include the semiconductor chip 100, an antenna module 200' including the main antenna 201 and the sub-antenna 202, the molding member 300, the redistribution structure 400, the external connection member 500, and a heat discharging member 600.

The heat discharging member 600 may include a conductive material. For example, in an embodiment, the heat discharging member 600 may include at least one metal selected from Cu, Al, Ti, Ta, tungsten (W), Ni, or may include a metal paste including the metal, or may include a metal tape including the metal. However, embodiments of the present inventive concept are not limited thereto.

Heat generated by the semiconductor chip 100 via the heat discharging member 600 may be discharged to the outside of the semiconductor package 10. As shown in FIG. 3B, the heat discharging member 600 may be exposed by the molding member 300. For example, the molding member 300 may not cover the heat discharging member 600. In an embodiment, the heat discharging member 600 may be disposed on an upper surface of the semiconductor chip 100 and a portion of the upper surface of the molding member 300 and the lateral side surfaces and upper surface of the heat discharging member 600 may be exposed. For example, the inactive surface 101B may directly contact a lower surface of the heat discharging member 600.

The heat discharging member 600 and the molding member 300 may constitute an external shape of the semiconductor package 30, and the redistribution structure 400 may be arranged by using the molding member 300. In an embodiment, due to the existence of the heat discharging member 600, the thickness 100T of the semiconductor chip 100 and the thickness 300T of the molding member 300 may be substantially the same as each other. However, a thickness 200'T of the antenna module 200' may be greater than the thickness 100T of the semiconductor chip 100. For example, the level of the uppermost surface of the semiconductor chip 100 (e.g., the inactive surface 101B) and the level of the uppermost surface 300S of the molding member 300 may be substantially the same as each other, and a level of an uppermost surface 200'S of the antenna module 200' may be higher than these levels. In some embodiments, the level of the uppermost surface 200'S of the antenna module 200' may be higher than a level of a lowermost surface of the heat discharging member 600, and may be lower than the level of the uppermost surface of the heat discharging member 600. As shown in FIG. 3B, in an embodiment, a portion of a side surface of the antenna module 200' and an upper surface of the antenna module 200' may be exposed from the molding member 300.

Figure 4:
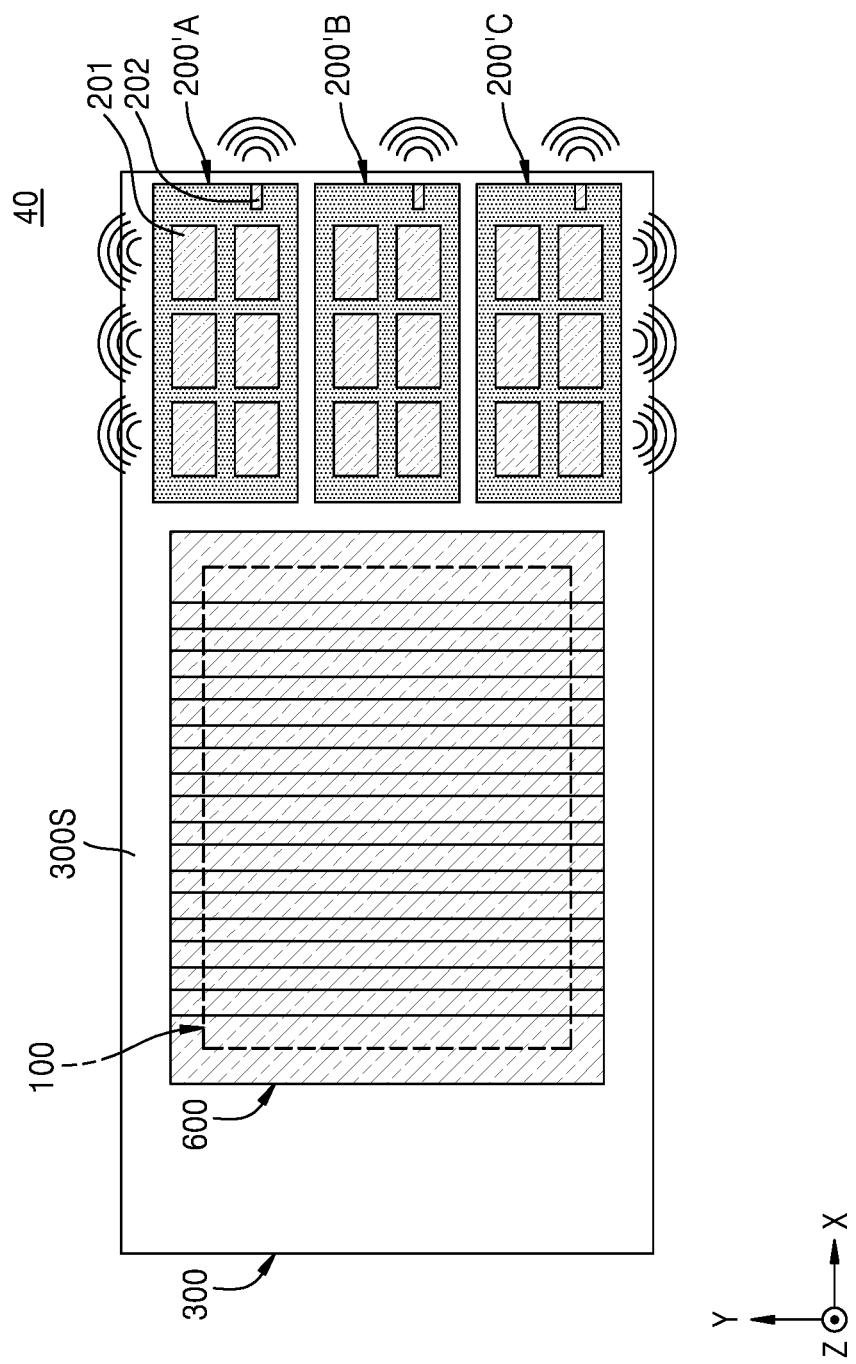
FIG. 4 is a plan view of a semiconductor package according to an embodiment of the present inventive concept.

FIG. 4 is a plan view of a semiconductor package 40 according to an embodiment of the present inventive concept.

Most of the components constituting the semiconductor package 40 and materials included in the components to be described below may be substantially the same as or similar to those described with reference to FIGS. 1A through 1C, 3A, and 3B. Thus, for convenience of description, differences from the semiconductor packages 10 and 30 described above are mainly described and a repeated description of similar or identical components may be omitted.

Referring to FIG. 4, the semiconductor package 30 may include the semiconductor chip 100, first to third antenna modules 200'A, 200'B, and 200'C, the molding member 300, a redistribution structure, and an external connection member, and the heat discharging member 600.

The first to third antenna modules 200'A, 200'B, and 200'C may be constituted by a plurality of parts, which are separated from each other, and each of the plurality of parts may be arranged to be spaced apart by a certain interval (e.g., a first interval) from any side surface of the semiconductor chip 100. For example, the plurality of parts may form a group, and form the first to third antenna modules 200'A, 200'B, and 200'C.

Each of the plurality of parts of the first to third antenna modules 200'A, 200'B, and 200'C may include the main antenna 201, the sub-antenna 202, a base board, and a wiring layer. In some embodiments, each of the plurality of parts of the first to third antenna modules 200'A, 200'B, and 200'C may include a PCB.

Due to the existence of the heat discharging member 600, the thickness 100T of the semiconductor chip 100 and the thickness 300T of the molding member 300 may be substantially the same as each other, but a thickness of each of the plurality of parts of the first to third antenna modules 200'A, 200'B, and 200'C may be greater than the thickness 100T of the semiconductor chip 100. For example, the level of the uppermost surface of the semiconductor chip 100 and the level of the uppermost surface of the molding member 300 may be substantially the same as each other, and a level of each of the plurality of parts of the first to third antenna modules 200'A, 200'B, and 200'C may be higher than these levels. In some embodiments, the level of the uppermost surface of each of the plurality of parts of the antenna modules 200'A, 200'B, and 200'C may be higher than the level of the lowermost surface of the heat discharging member 600, and may be lower than the level of the uppermost surface of the heat discharging member 600.

Figure 5:
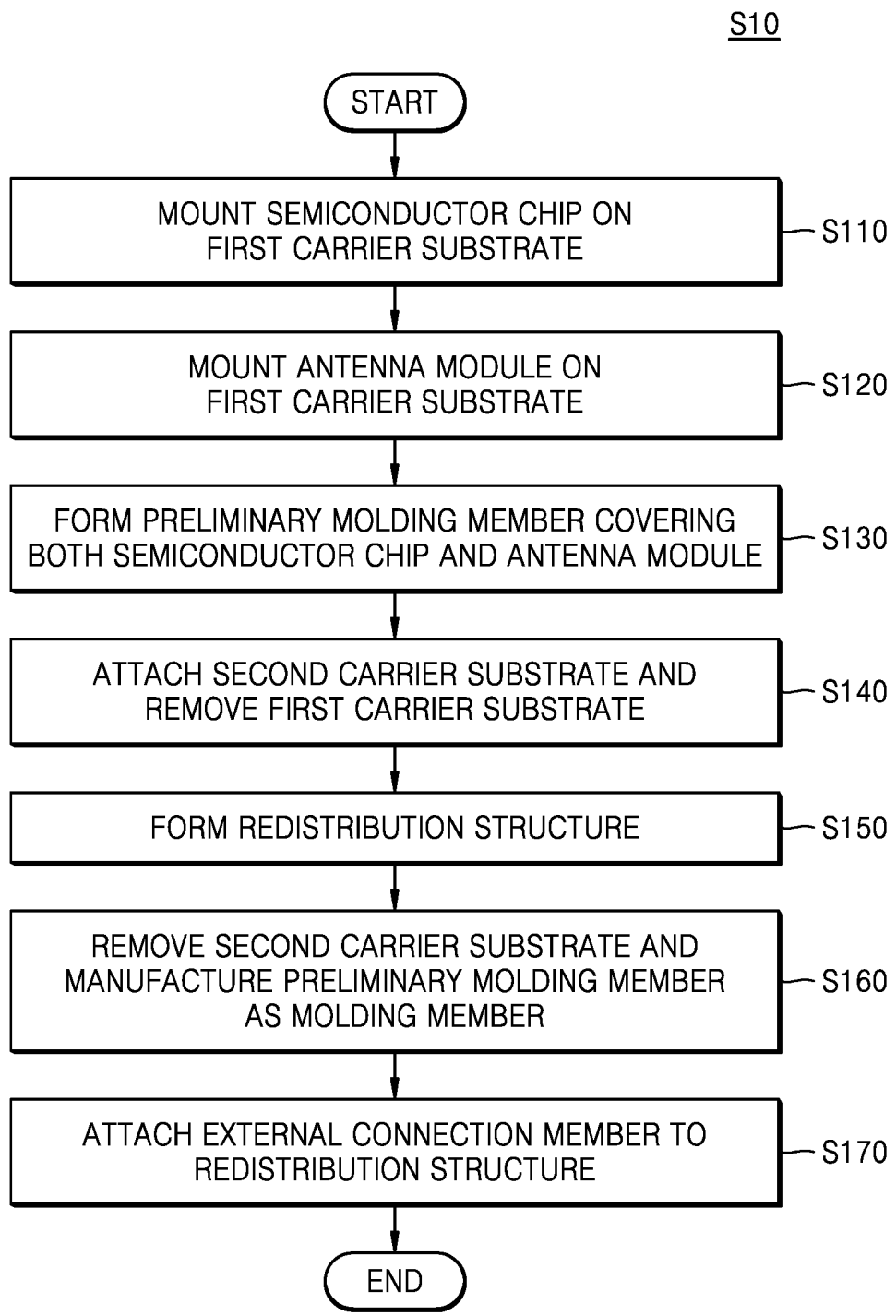
FIG. 5 is a block diagram of a manufacturing method of a semiconductor package, according to an embodiment of the present inventive concept.

FIG. 5 is a block diagram of a manufacturing method S10 of a semiconductor package, according to an embodiment of the present inventive concept.

Referring to FIG. 5, the manufacturing method S10 of a semiconductor package may include a process sequence of first through seventh operations in blocks S110 through S170.

When a certain embodiment is implemented differently, a particular process sequence may be executed differently from the sequence to be described. For example, two consecutively described processes may be substantially performed at the same time or in a sequence opposite to the described sequence.

The manufacturing method S10 of a semiconductor package according to an embodiment of the present inventive concept may include the first operation in block S110 in which a semiconductor chip is mounted on a first carrier substrate, the second operation in block S120 in which an antenna module is mounted on the first carrier substrate, the third operation in block S130 in which a preliminary molding member covering both the semiconductor chip and the antenna module is formed, the fourth operation in block S140 in which a second carrier substrate is attached and the first carrier substrate is removed, the fifth operation in block S150 in which the redistribution structure is formed, the sixth operation in block S160 in which the second carrier substrate is removed and the preliminary molding member is manufactured as the molding member, and the seventh operation in block S170 in which the external connection member is attached to the redistribution structure.

Technical characteristics of each of the first through seventh operations in blocks S110 through S170 are described in detail later with reference to FIGS. 6 through 11.

FIGS. 6 through 11 are cross-sectional views illustrating a manufacturing method of a semiconductor package 10, according to embodiments of the present inventive concept.

Figure 6:
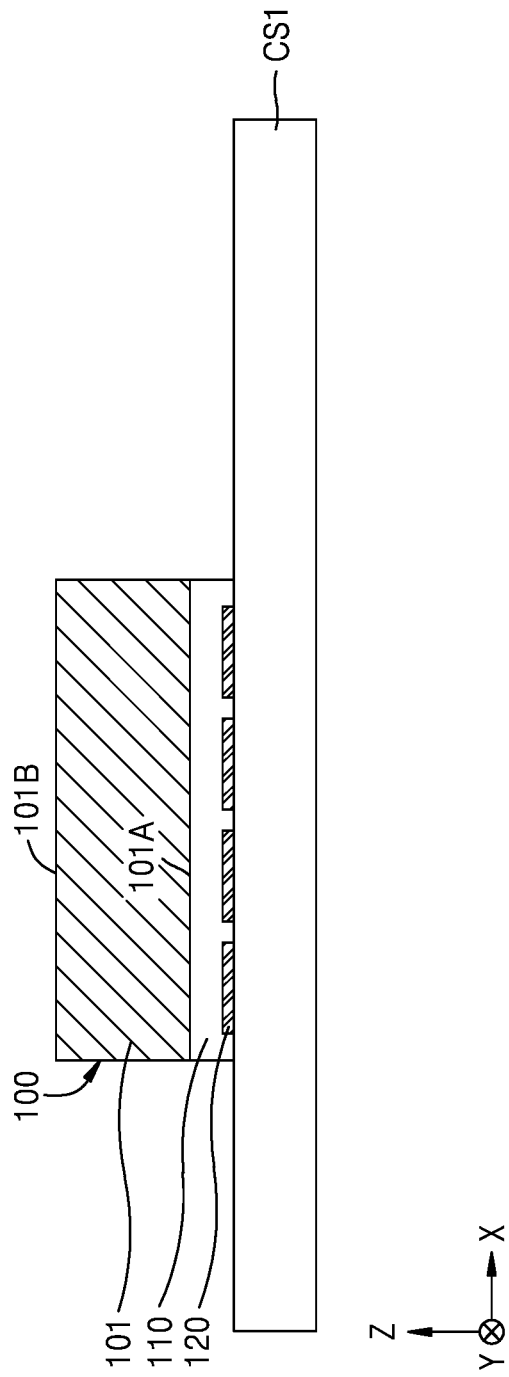
FIGS. 6 through 11 are cross-sectional views illustrating a manufacturing method of a semiconductor package, according to embodiments of the present inventive concept.

Referring to FIG. 6, the semiconductor chip 100 may be mounted on a first carrier substrate CS1.

In an embodiment, the first carrier substrate CS1 may include, for example, glass, silicon, or aluminum oxide. However, embodiments of the present inventive concept are not limited thereto. In an embodiment, an adhesive layer may be formed between the first carrier substrate CS1 and the semiconductor chip 100 (e.g., in the Z direction) to attach the semiconductor chip 100 to the first carrier substrate CS1. However, embodiments of the present inventive concept are not limited thereto. The adhesive layer may have a liquid shape or a gel shape so that a shape of the adhesive layer is easily changeable under a certain level of pressure.

The semiconductor chip 100 may include a semiconductor substrate 101 which includes the active surface 101A and the inactive surface 101B facing each other (e.g., in the Z direction).

In an embodiment, the semiconductor substrate 101 may include, for example, silicon. However, embodiments of the present inventive concept are not limited thereto. For example, in an embodiment, the semiconductor substrate 101 may include a semiconductor element such as germanium (Ge), or a compound semiconductor such as silicon carbide (SiC), gallium arsenide (GaAs), indium arsenide (InAs), and indium phosphide (InP). In an embodiment, the semiconductor substrate 101 may have a silicon on insulator (SOI) structure. For example, the semiconductor substrate 101 may include a buried oxide (BOX) layer. The semiconductor substrate 101 may include a conductive region, for example, a well doped with impurities, or a structure doped with impurities. In addition, the semiconductor substrate 101 may have various device isolation structures such as a shallow trench isolation (STI) structure.

In an embodiment, a circuit unit including an individual unit element for implementing an integrated circuit function of a semiconductor element by using the semiconductor manufacturing process may be formed in the semiconductor substrate 101.

On the semiconductor substrate 101, the interlayer insulating layer 110 arranged between a metal layer and the semiconductor substrate 101 may be formed. In an embodiment, the interlayer insulating layer 110 may include a low-k material layer having a lower permittivity than silicon oxide. For example, a dielectric material constituting the interlayer insulating layer 110 may include oxides such as phosphor silicate glass (PSG), boro-phosphor silicate glass (BPSG), undoped silicate glass (USG), tetra ethyl ortho silicate (TEOS), plasma enhanced-TEOS (PE-TEOS), high density plasma-chemical vapor deposition (HDP-CVD) oxide, a low dielectric material used in back end of line (BEOL), an ultra-low dielectric material, etc. However, embodiments of the present inventive concept are not limited thereto.

In some embodiments, the interlayer insulating layer 110 may be formed in a structure in which a first interlayer insulating layer, a second interlayer insulating layer, a third interlayer insulating layer, and a fourth interlayer insulating layer are sequentially stacked (e.g., in the Z direction). However, embodiments of the present inventive concept are not limited thereto and the number of interlayer insulating layers constituting the interlayer insulating layer 110 may vary.

The electrode pad 120 may be electrically connected to a circuit unit of the semiconductor chip 100, and may electrically connect the semiconductor chip 100 to an external electrical device. The electrode pad 120 may, as a portion via which an electrical signal is input/output to/from the semiconductor chip 100, be equipped in a plurality on the semiconductor chip 100, and may include Al, W, Cu, Ni, or a combination thereof. However, embodiments of the present inventive concept are not limited thereto. In an embodiment, after a metal such as Al is formed at a certain thickness on the semiconductor chip 100, the electrode pad 120 may be manufactured by patterning a shape of the electrode pad 120 by using a photo processing and an etching process. However, embodiments of the present inventive concept are not limited thereto and the method in which the electrode pad 120 is formed may vary.

Figure 7:
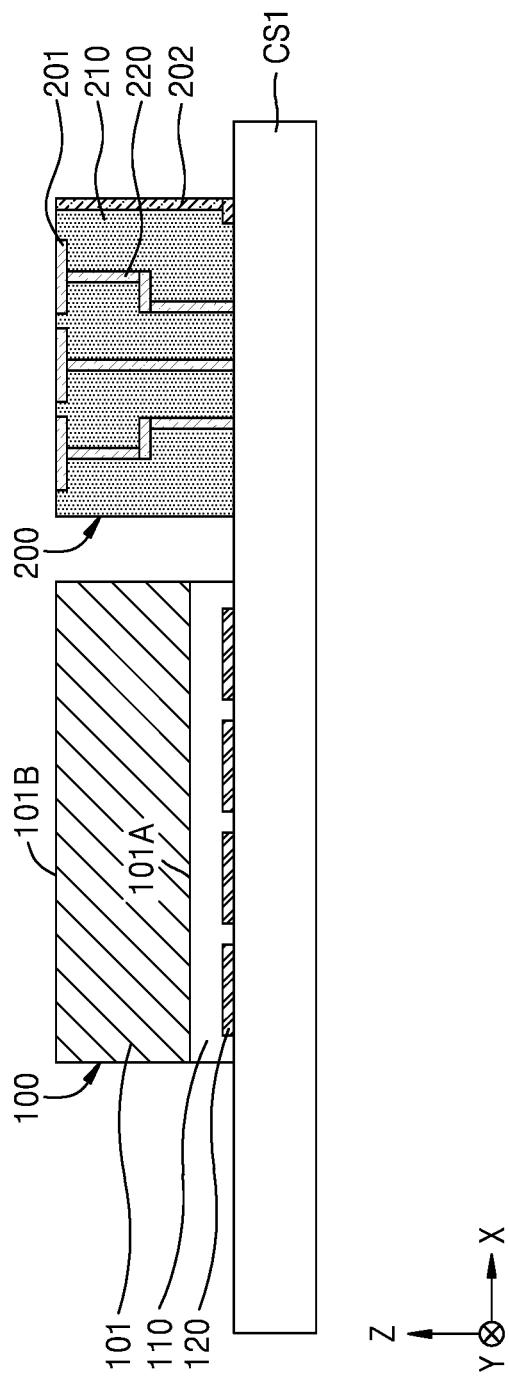

Referring to FIG. 7, the antenna module 200 may be mounted on the first carrier substrate CS1 in parallel with the semiconductor chip 100.

The antenna module 200 may be spaced apart by a certain interval (e.g., a first interval) from one side surface of the semiconductor chip 100, and may be attached to the first carrier substrate CS1. For example, in an embodiment, the antenna module 200 may be spaced apart from a lateral side surface of the semiconductor chip 100 by a first interval in the X direction. In an embodiment, an adhesive layer may be formed between the first carrier substrate CS1 and the antenna module 200 to attach the antenna module 200 to the first carrier substrate CS1. The adhesive layer may have a liquid shape or a gel shape so that a shape of the adhesive layer is easily changeable under certain pressure. However, embodiments of the present inventive concept are not limited thereto.

The antenna module 200 may include the main antenna 201, the sub-antenna 202, the base board 210, and the wiring layer 220. In an embodiment, the main antenna 201 may include a patch antenna. In addition, the main antenna 201 may be arranged to be exposed to the outside. For example, an upper surface of the main antenna 201 may be exposed to the outside. The sub-antenna 202 may include a Yagi antenna. The sub-antenna 202 may be arranged at a certain interval on one side surface of the antenna module 200.

Figure 8:
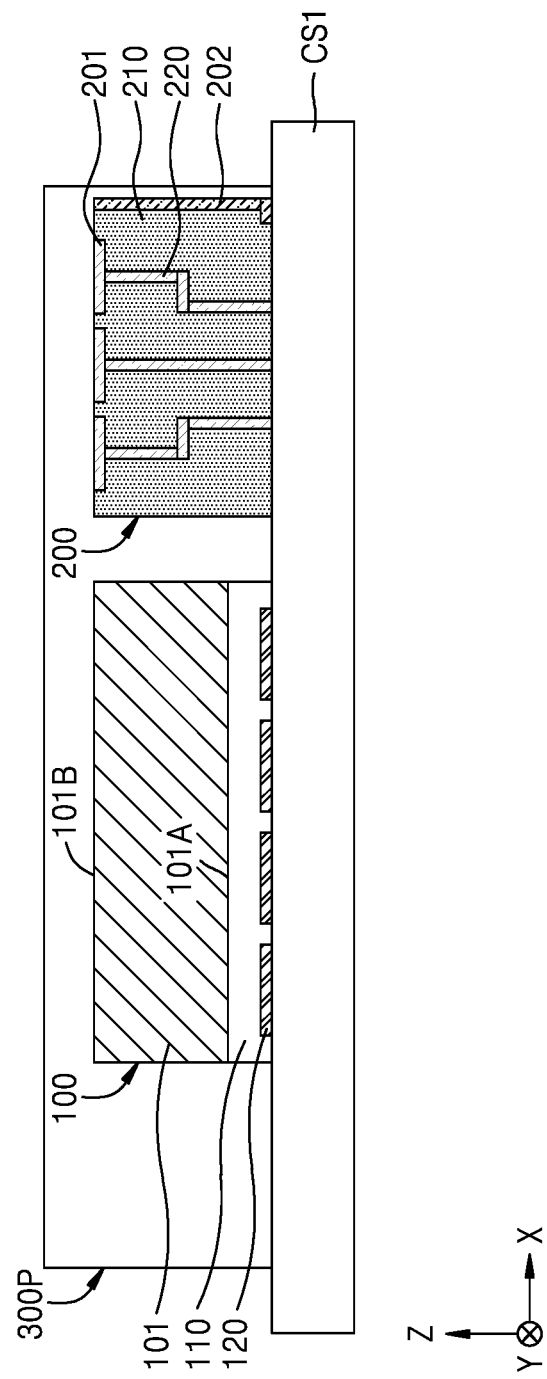

Referring to FIG. 8, a preliminary molding member 300P covering both the semiconductor chip 100 and the antenna module 200 may be formed.

The preliminary molding member 300P may protect the semiconductor chip 100 and the antenna module 200 from external influences such as impact. In an embodiment, the preliminary molding member 300P may include an epoxy mold compound (EMC), resin, etc. In addition, the preliminary molding member 300P may be formed by using processes such as compression molding, lamination, and screen printing. However, embodiments of the present inventive concept are not limited thereto.

In some embodiments, the preliminary molding member 300P may be formed to cover both an upper surface and lateral side surfaces of each of the semiconductor chip 100 and the antenna module 200. In other embodiments, the preliminary molding member 300P may surround only lateral side surfaces of each of the semiconductor chip 100 and the antenna module 200 so that the upper surface of each of the semiconductor chip 100 and the antenna module 200 is exposed to the outside. In addition, in some embodiments, the preliminary molding member 300P may be formed before the antenna module 200 is attached to the first carrier substrate CS1. In this embodiment, the preliminary molding member 300P may be formed to include an opening where the antenna module 200 is arranged in a subsequent process.

Figure 9:
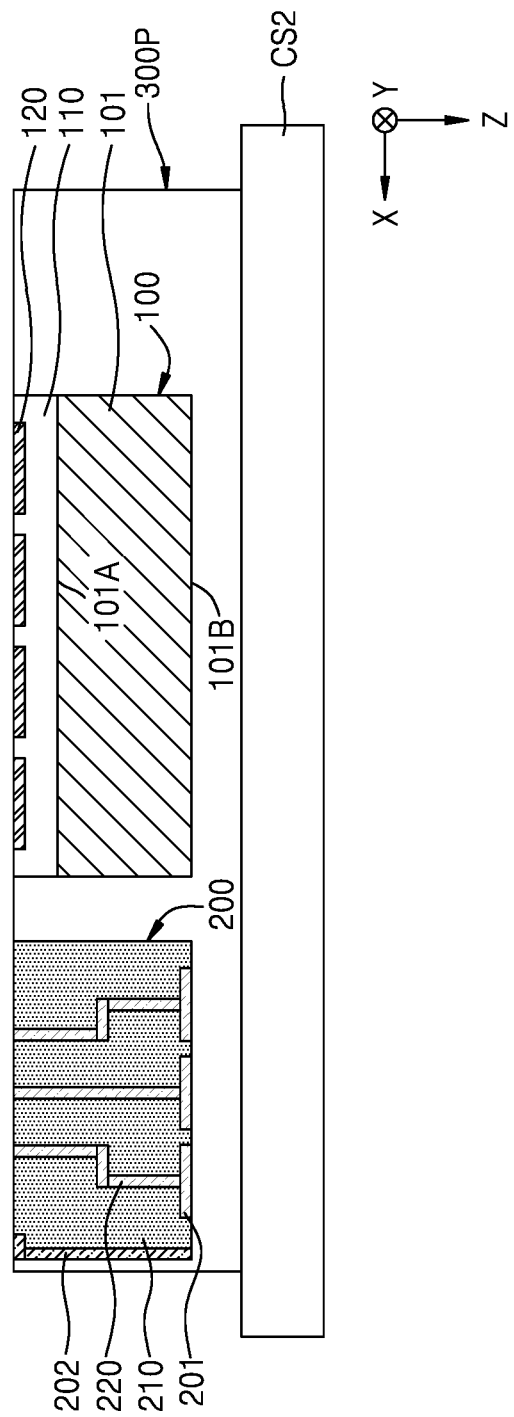

Referring to FIG. 9, a second carrier substrate CS2 may be attached on the preliminary molding member 300P so that the second carrier substrate CS2 faces the first carrier substrate (CS1, refer to FIG. 8). For example, the second carrier substrate CS2 may be disposed on an opposite surface (e.g., in the Z direction) of the preliminary molding member 300P as compared to the first carrier substrate CS1.

To remove the first carrier substrate (CS1, refer to FIG. 8) and perform a subsequent process, the second carrier substrate CS2 may be attached. In an embodiment, the second carrier substrate CS2 may include, for example, glass, silicon, or aluminum oxide. However, embodiments of the present inventive concept are not limited thereto. In an embodiment, an adhesive layer may be formed between the second carrier substrate CS2 and the preliminary molding member 300P (e.g., in the Z direction) to attach the preliminary molding member 300P to the second carrier substrate CS2.

Thereafter, the first carrier substrate (CS1, refer to FIG. 8) may be removed. After the first carrier substrate (CS1, refer to FIG. 8) is removed, the second carrier substrate CS2 may be overturned and a subsequent process may be performed so that the second carrier substrate CS2 is positioned under the preliminary molding member 300P.

Figure 10:
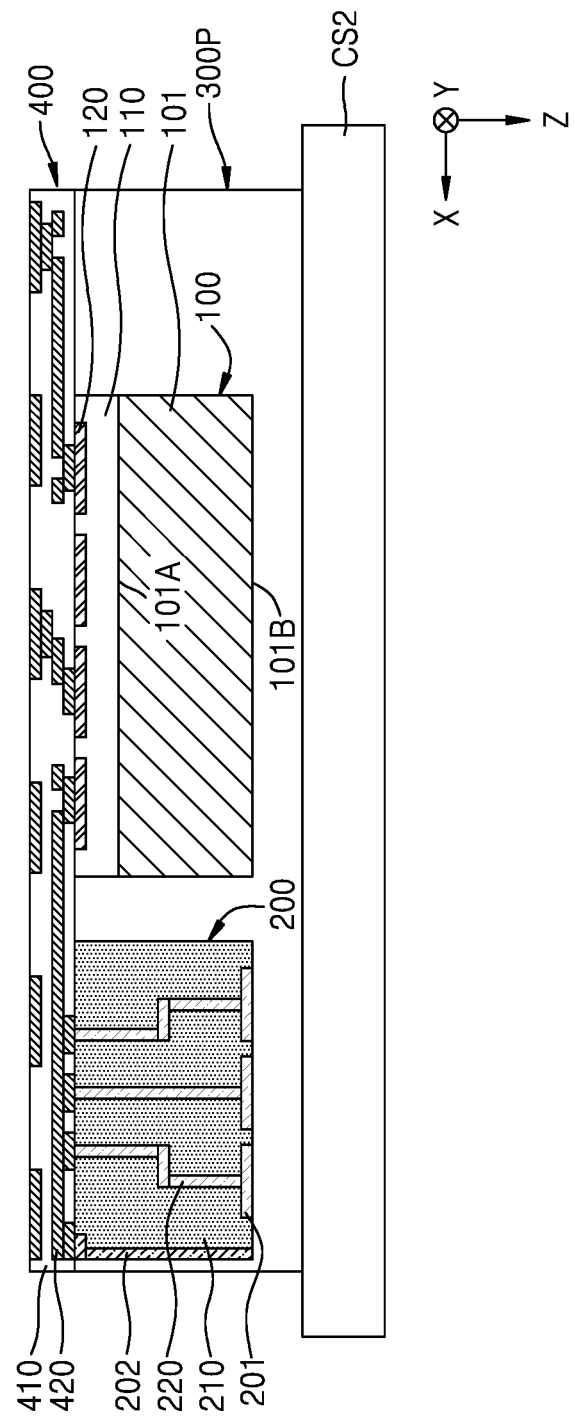

Referring to FIG. 10, the redistribution structure 400 may be formed on the semiconductor chip 100, the antenna module 200, and the preliminary molding member 300P.

The redistribution structure 400 may include an insulating layer 410 and the metal distribution layer 420. For example, in an embodiment, the redistribution structure 400 may include Cu, Ni, Au, Cr, Ti, or Pd, or may include the metal distribution layer 420 including an alloy thereof. The metal distribution layer 420 may be formed by using an electroplating process. However, embodiments of the present inventive concept are not limited thereto.

The metal distribution layer 420 of the redistribution structure 400 may be arranged to electrically connect the electrode pad 120 of the semiconductor chip 100 to the wiring layer 220 of the antenna module 200. For example, the metal distribution layer 420 may connect a portion of the electrode pad 120, which processes a communication signal, to the wiring layer 220.

Figure 11:
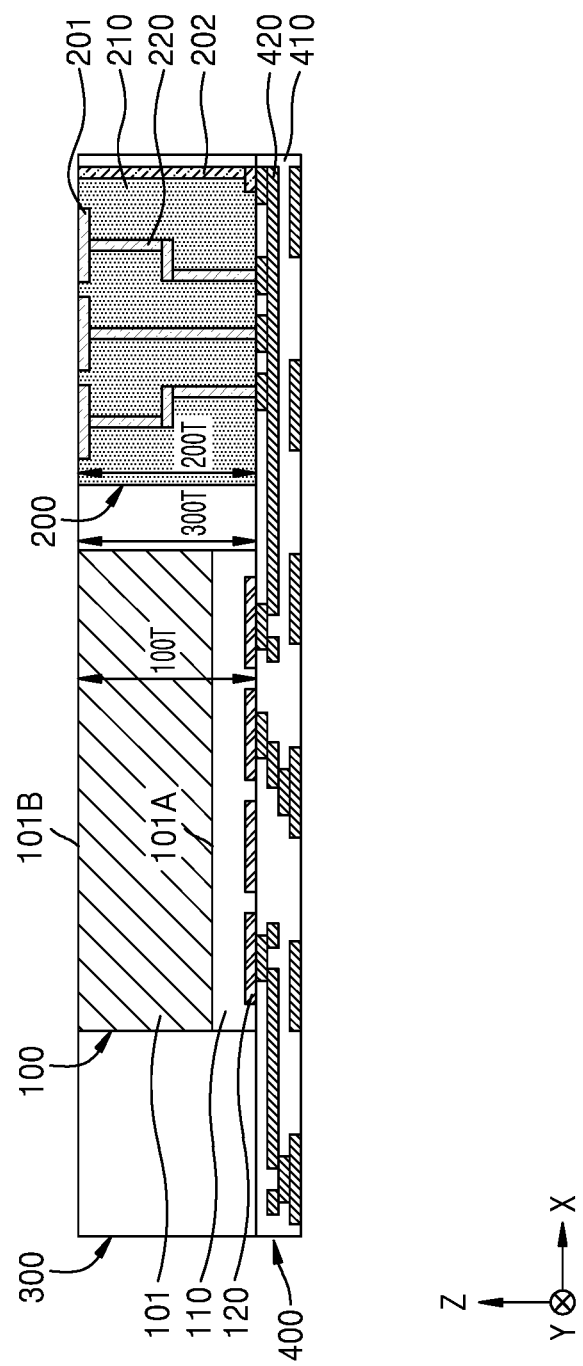

Referring to FIG. 11, the second carrier substrate (CS2, refer to FIG. 10) may be removed, and the preliminary molding member (300P, refer to FIG. 10) may be manufactured as the molding member 300.

In an embodiment, a laser may be irradiated to the second carrier substrate (CS2, refer to FIG. 10) to separate/remove the second carrier substrate (CS2, refer to FIG. 10). Due to irradiation of the laser, a bonding force between the preliminary molding member (300P, refer to FIG. 10) and the second carrier substrate (CS2, refer to FIG. 10) may be weakened.

In an embodiment, the molding member 300 may then be manufactured by grinding the preliminary molding member (300P, refer to FIG. 10) by using a chemical mechanical polishing (CMP) process or an etch-back process so that the inactive surface 101B of the semiconductor chip 100 and the main antenna 201 of the antenna module 200 are exposed. In this manner, the thickness 100T of the semiconductor chip 100, the thickness 200T of the antenna module 200, and the thickness 300T of the molding member 300 may be substantially the same as each other.

Referring to FIG. 1B again, the external connection member 500 may be attached to the redistribution structure 400, such as a lower surface of the redistribution structure 400.

In some embodiments, the external connection member 500 may include a solder ball. The solder ball may be formed in a sphere shape, and may be attached to the redistribution structure 400. In other embodiments, the external connection member 500 may be formed as a solder bump on the redistribution structure 400. However, embodiments of the present inventive concept are not limited thereto.

By using the manufacturing process described above, the semiconductor package 10 according to an embodiment of the present inventive concept may be completed. While the semiconductor package 10 has been described with a chip-first manufacturing method of the FO-WLP, embodiments of the present inventive concept are not limited thereto. For example, the semiconductor package 10 may be implemented in a chip-last manufacturing method in which the redistribution structure 400 is formed on the first carrier substrate (CS1, refer to FIG. 6) in advance, and the semiconductor chip 100 is then mounted on the redistribution structure 400.

Therefore, the semiconductor package 10 according to an embodiment of the present inventive concept may, by stably integrating the semiconductor chip 100 and the antenna module 200, increase the degree of freedom of design, and decrease the occurrence of performance errors.

Figure 12:
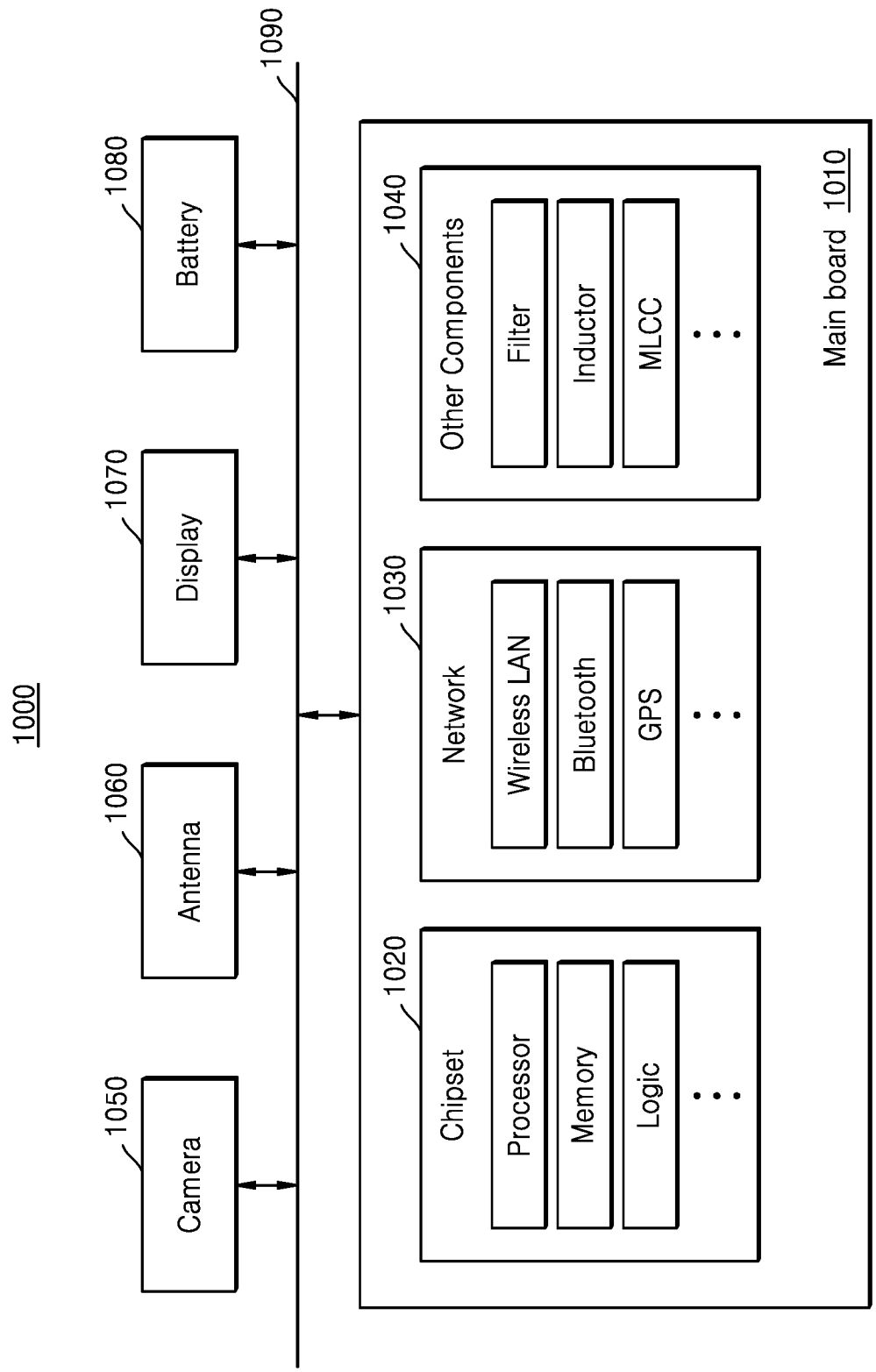
FIG. 12 is a configuration diagram of an electronic device including a semiconductor package, according to an embodiment according to an embodiment of the present inventive concept.

FIG. 12 is a configuration diagram of an electronic device 1000 including a semiconductor package, according to an embodiment of the present inventive concept.

Referring to FIG. 12, the electronic device 1000 may include a main board 1010. The main board 1010 may include a chipset 1020, a network 1030, an other components 1040, or the like that may be physically and/or electrically connected to each other. These components may be combined with other electronic components to be described later to form various types of signal lines 1090.

In an embodiment, the chipset 1020 may include a memory chip such as a volatile memory, a non-volatile memory, and a flash memory, an application processor chip such as a central processor, a graphics processor, a digital signal processor, an encoding processor, a microprocessor, and a microcontroller, and a logic chip such as an analog to digital converter and an application-specific integrated circuit (ASIC), etc. In addition, other types of chip-related electronic components may be included. In addition, the chipset 1020 may be combined with each other.

In an embodiment, the network 1030 may include Wi-Fi (IEEE 802.11 family, or the like), WiMAX (IEEE 802.16 family, or the like), IEEE 802.20, long term evolution (LTE) (IEEE), EV-DO, HSPA+, HSDPA+, HSUPA+, EDGE, GSM, GPS, GPRS, CDMA, TDMA, DECT, Bluetooth, 3G, 4G, 5G, and any other wired/wireless protocols designated subsequently. In addition, any other wired/wireless standards and protocols may be included. In addition, the network 1030 may be combined with each other with the chipset 1020.

In an embodiment, the other components 1040 may include a high frequency inductor, a ferrite inductor, a power inductor, a ferrite bead, low temperature co-firing ceramics (LTCC), an electromagnetic interference (EMI) filter, a multi-layer ceramic capacitor (MLCC), etc. In addition, manual components used for other various applications, or the like, may be included. In addition, the other components 1040 may be combined with each other with the chipset 1020 and/or the network 1030.

Depending on a type of electronic device 1000, the electronic device 1000 may include other electronic components which are physically and/or electrically connected to the main board 1010, or are not so. In an embodiment, other electronic components, may include, for example, a camera 1050, an antenna 1060, a display 1070, a battery 1080, an audio codec, a video codec, a power amplifier, a compass, an accelerometer, a gyroscope, a speaker, a bulk storage, a compact disk (CD), a digital versatile disk (DVD), etc. In addition, depending on the type of electronic device 1000, other electronic components used for various applications, or the like, may be included.

In an embodiment, the electronic device 1000 may include a smartphone, a personal digital assistant, a digital video camera, a digital still camera, a network system, a computer, a monitor, a tablet, a laptop, a netbook, a television, a video game console, a smart watch, a smart watch, etc. In addition, the electronic device 1000 may include any other electronic device processing data. For example, the electronic device 1000 may be various different small, medium or large-scaled electronic devices.

A semiconductor package according to an embodiment of the present inventive concept may be applied to various applications such as the electronic device 1000 which varies as described above. For example, the semiconductor packages 10, 20, 30, and 40 described above with reference to FIGS. 1A through 4 may be mounted in the electronic device 1000 as applications of antennas and memory chips.

While the present inventive concept has been particularly shown and described with reference to non-limiting embodiments thereof, it will be understood that various changes in form and details may be made therein without departing from the spirit and scope of the present inventive concept.

What is claimed is:

1. A semiconductor package comprising:
   a semiconductor chip comprising an active surface and an inactive surface facing each other;
   at least one antenna module arranged adjacent to the semiconductor chip, the at least one antenna module comprising a main antenna and a sub-antenna;
   a redistribution structure disposed on the semiconductor chip and the at least one antenna module, the redistribution structure electrically connecting the active surface of the semiconductor chip to the at least one antenna module; and
   a molding member surrounding the semiconductor chip and the at least one antenna module, wherein the molding member the semiconductor chip and the main antenna are co-planar with each other in a thickness direction of the semiconductor package,
   wherein the inactive surface of the semiconductor chip and the main antenna are exposed from the molding member, and the sub-antenna is covered by the molding member.

2. The semiconductor package of claim 1, wherein:
   the at least one antenna module comprises a printed circuit board; and
   the printed circuit board comprises a plurality of wiring layers electrically connecting each of the main antenna and the sub-antenna to the redistribution structure.

3. The semiconductor package of claim 2, further comprising an antenna protection layer disposed on the main antenna.

4. The semiconductor package of claim 1, wherein a thickness of the at least one antenna module is greater than or equal to a thickness of the semiconductor chip.

5. The semiconductor package of claim 1, wherein:
   the at least one antenna module includes a plurality of parts that are spaced apart from each other; and
   the plurality of parts are spaced apart from one side surface of the semiconductor chip by a first interval.

6. The semiconductor package of claim 1, wherein a level of an uppermost surface of the semiconductor chip, a level of an uppermost surface of the at least one antenna module, and a level of an uppermost surface of the molding member are substantially identical to each other.

7. The semiconductor package of claim 1, wherein:
   the main antenna comprises a patch antenna arranged on an upper surface of the antenna module; and
   the sub-antenna comprises a Yagi antenna arranged on a side surface of the antenna module.

8. The semiconductor package of claim 7, wherein, in a planar view, patches of the main antenna are arranged in a plurality of rows and columns.

9. The semiconductor package of claim 1, wherein, in the semiconductor package, the main antenna is exposed to the outside.

10. The semiconductor package of claim 1, further comprising an external connection member arranged under the redistribution structure,
    wherein the semiconductor package comprises a fan-out wafer level package.

11. A semiconductor package comprising:
    a semiconductor chip comprising an active surface and an inactive surface facing each other;
    at least one antenna module arranged adjacent to the semiconductor chip, the at least one antenna module comprising a main antenna and a sub-antenna, the main antenna and the sub-antenna are disposed on a same layer as each other, a redistribution structure disposed on the semiconductor chip and the at least one antenna module, the redistribution structure electrically connecting the active surface of the semiconductor chip to the at least one antenna module;

a molding member surrounding the semiconductor chip and the at least one antenna module, wherein the molding member, the semiconductor chip and the at least one antenna module are co-planar with each other in a thickness direction of the semiconductor package; and a heat discharging member arranged on the semiconductor chip, wherein the main antenna is exposed from the molding member, and the sub-antenna is covered by the molding member, and a thickness of the at least one antenna module is greater than a thickness of the semiconductor chip.

12. The semiconductor package of claim 11, wherein:

the inactive surface of the semiconductor chip directly contacts a lower surface of the heat discharging member;

a level of an upper surface of the at least one antenna module is higher than a level of the lower surface of the heat discharging member; and the level of the upper surface of the at least one antenna module is lower than a level of an upper surface of the heat discharging member.

13. The semiconductor package of claim 12, wherein a portion of a side surface of the at least one antenna module is exposed from the molding member.

14. The semiconductor package of claim 11, wherein the at least one antenna module comprises a printed circuit board, wherein the printed circuit board comprises:

a first wiring layer electrically connecting the main antenna to the redistribution structure; and a second wiring layer electrically connecting the sub-antenna to the redistribution structure.

15. The semiconductor package of claim 11, wherein:

the main antenna comprises a patch antenna arranged on an upper surface of the at least one antenna module;

the sub-antenna comprises a Yagi antenna arranged on a side surface of the antenna module; and the semiconductor package comprises a fan-out wafer level package.

16. A semiconductor package comprising:

a semiconductor chip comprising an active surface and an inactive surface facing each other;

a molding member comprising an opening in a portion thereof, and surrounding the semiconductor chip;

at least one antenna module arranged in the opening of the molding member, the at least one antenna module comprising a main antenna and a sub-antenna on a printed circuit board, wherein the molding member, the semiconductor chip and the main antenna are co-planar with each other in a thickness direction of the semiconductor package;

a redistribution structure arranged under the semiconductor chip, the molding member, and the at least one antenna module, the redistribution structure electrically connecting the active surface of the semiconductor chip to the at least one antenna module; and an external connection member arranged under the redistribution structure, wherein the main antenna is exposed to the outside from the molding member, and the sub-antenna directly contacts the molding member.

17. The semiconductor package of claim 16, wherein the printed circuit board comprises:

a base board; and a wiring layer configured to penetrate the base board, the wiring layer electrically connecting the redistribution structure to the main antenna, and the redistribution structure to the sub-antenna.

18. The semiconductor package of claim 16, wherein:

the main antenna comprises a patch antenna having a plurality of rows and columns and arranged on an upper surface of the antenna module, the sub-antenna comprises a Yagi antenna arranged on a side surface of the antenna module, and the semiconductor package comprises a fan-out wafer level package.

19. The semiconductor package of claim 18, wherein:

the patch antenna includes a plurality of parts that are separated from each other; and the plurality of parts are spaced apart from one side surface of the semiconductor chip by a first interval.

20. The semiconductor package of claim 16, further comprising a heat discharging member arranged to directly contact the inactive surface of the semiconductor chip.

* * * * *